(12) United States Patent
Kabutoya

(10) Patent No.: US 12,382,647 B2
(45) Date of Patent: Aug. 5, 2025

(54) SEMICONDUCTOR DEVICE AND METHOD FOR MANUFACTURING SEMICONDUCTOR DEVICE

(71) Applicant: KYOCERA Corporation, Kyoto (JP)

(72) Inventor: Shingo Kabutoya, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 395 days.

(21) Appl. No.: 17/920,221

(22) PCT Filed: Apr. 22, 2021

(86) PCT No.: PCT/JP2021/016326
§ 371 (c)(1),
(2) Date: Oct. 20, 2022

(87) PCT Pub. No.: WO2021/215505
PCT Pub. Date: Oct. 28, 2021

(65) Prior Publication Data
US 2023/0178663 A1 Jun. 8, 2023

(30) Foreign Application Priority Data
Apr. 24, 2020 (JP) ................................ 2020-077020

(51) Int. Cl.
*H10D 8/60* (2025.01)
*H10D 8/01* (2025.01)
*H10D 64/01* (2025.01)
*H10D 64/64* (2025.01)

(52) U.S. Cl.
CPC ............. *H10D 8/605* (2025.01); *H10D 8/051* (2025.01); *H10D 64/01* (2025.01); *H10D 64/64* (2025.01)

(58) Field of Classification Search
CPC ............................... H10D 8/605; H10D 8/051
See application file for complete search history.

(56) References Cited

U.S. PATENT DOCUMENTS

| | | | |
|---|---|---|---|
| 6,489,204 B1 | 12/2002 | Tsui | |
| 7,560,787 B2 * | 7/2009 | Kocon | ................ H10D 30/665 257/495 |
| 10,777,689 B1 * | 9/2020 | Yau | .................... H10D 62/8325 |

(Continued)

FOREIGN PATENT DOCUMENTS

| | | |
|---|---|---|
| CN | 103632959 A | 3/2014 |
| CN | 109473470 A | 3/2019 |

(Continued)

*Primary Examiner* — Ali Naraghi
(74) *Attorney, Agent, or Firm* — Volpe Koenig

(57) ABSTRACT

A semiconductor device A1 includes: a semiconductor layer including a trench; an insulating film covering an inner surface of the trench; a conductor embedded in the trench covered with the insulating film; a silicide layer; and a metal layer. A Schottky junction is formed by the silicide layer and a region being part of a semiconductor layer surface and being adjacent to the trench. A region including an end face of the silicide layer and an upper end face of the insulating film is covered with the metal layer, with no gap between one part and another part of the metal layer on the region. The end face is located at elevations higher than the upper end face. The metal layer and the silicide layer contain the same kind of metallic element.

4 Claims, 5 Drawing Sheets

(56) References Cited

U.S. PATENT DOCUMENTS

| | | | |
|---|---|---|---|
| 2005/0062124 A1* | 3/2005 | Chiola | H10D 8/60 |
| | | | 257/E29.023 |
| 2005/0202637 A1* | 9/2005 | Chiola | H10D 62/106 |
| | | | 438/270 |
| 2008/0083966 A1 | 4/2008 | Oonishi | |
| 2009/0294859 A1* | 12/2009 | Hshieh | H10D 84/146 |
| | | | 257/E21.085 |
| 2010/0207205 A1* | 8/2010 | Grebs | H01L 23/544 |
| | | | 257/334 |
| 2011/0227151 A1* | 9/2011 | Hsu | H10D 30/665 |
| | | | 257/334 |
| 2012/0156862 A1 | 6/2012 | Riley et al. | |
| 2014/0312452 A1 | 10/2014 | Lin | |

FOREIGN PATENT DOCUMENTS

| | | |
|---|---|---|
| JP | H08-255919 A | 10/1996 |
| JP | 09-232597 A | 9/1997 |
| JP | 2004-253416 A | 9/2004 |

* cited by examiner

SEMICONDUCTOR DEVICE AND METHOD FOR MANUFACTURING SEMICONDUCTOR DEVICE

TECHNICAL FIELD

The present disclosure relates to a semiconductor device and a method for manufacturing a semiconductor device.

BACKGROUND OF INVENTION

Japanese Unexamined Patent Application Publication No. 9-232597 describes manufacturing a semiconductor device having a Schottky junction. Manufacturing the semiconductor device involves: forming an insulating film on a surface of a semiconductor layer including a trench; embedding a conductor in the trench; exposing a region being part of the surface of the semiconductor layer and being adjacent to the trench by etching the insulating film away from the region; and forming a Schottky junction on the region in the surface of the semiconductor layer.

SUMMARY

According to an aspect of the present disclosure, a semiconductor device includes a semiconductor layer, an insulating film, a conductor, a silicide layer, and a metal layer. The semiconductor layer includes a trench. An inner surface of the trench is covered with the insulating film. The conductor is embedded in the trench covered with the insulating film. A Schottky junction is formed by the silicide layer and a region being part of a surface of the semiconductor layer and being adjacent to the trench. A region including an end face of the silicide layer and an upper end face of the insulating film is covered with the metal layer, with no gap between one part and another part of the metal layer on the region. The end face is located at elevations higher than the upper end face of the insulating film covering an inner wall surface of the trench. The metal layer and the silicide layer contain the same kind of metallic element.

According to another aspect of the present disclosure, a method for manufacturing a semiconductor device includes: forming an insulating film on a surface of a semiconductor layer including a trench; embedding a conductor in the trench; exposing a region being part of a surface of the semiconductor layer and being adjacent to the trench by etching the insulating film away from the region; and forming a Schottky junction on the semiconductor layer. In the etching the insulating film, an upper end face of the insulating film covering an inner wall surface of the trench is lowered beyond the surface of the semiconductor layer. In the forming a Schottky junction, a metal layer is formed on the surface of the semiconductor layer, and a silicide layer is then formed by reaction between the metal layer and the semiconductor layer under heat treatment, with the Schottky junction being an interface between the silicide layer and the semiconductor layer. After the Schottky junction is formed, part of the metal layer is left unremoved to cover at least a region including an end face of the silicide layer and the upper end face of the insulating film with no gap between one part and another part of the metal layer on the region.

DESCRIPTION OF EMBODIMENTS

Hereinafter, an embodiment of the present disclosure will be described with reference to the accompanying drawings.

[Semiconductor Device]

Figure 1:
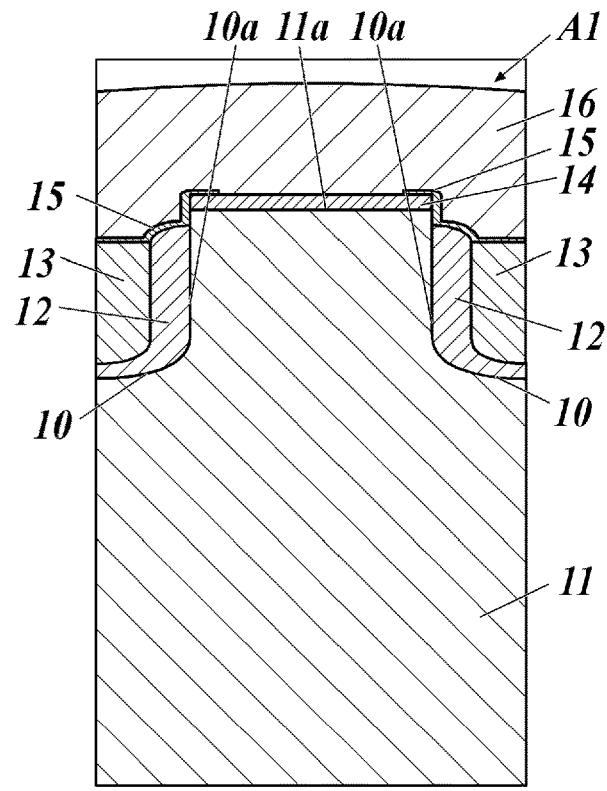
FIG. 1 is a schematic sectional view of a semiconductor device according to an embodiment of the present disclosure.
Figure 2:
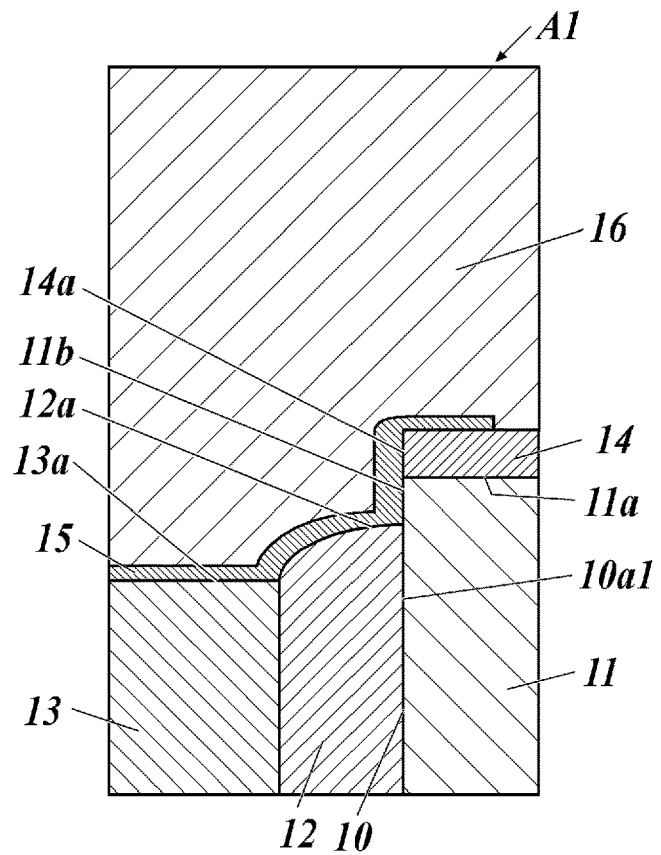
FIG. 2 is a partial enlargement of FIG. 1.

Referring to FIGS. 1 and 2, a semiconductor device A1 according to an embodiment of the present disclosure includes a semiconductor layer 11, an insulating film 12, a conductor 13, a silicide layer 14, a metal layer 15, and an upper surface electrode 16. The semiconductor layer 11 includes a trench 10. An inner surface 10a of the trench 10 is covered with the insulating film 12. The conductor 13 is embedded in the trench 10 covered with the insulating film 12. The silicide layer 14 and a region being part of a semiconductor layer surface 11a and being adjacent to the trench 10 form a Schottky junction. The silicide layer 14 has an end face 14a, which is located at elevations higher than an upper end face 12a of the insulating film 12 covering an inner wall surface 10a1 of the trench 10. A region including the end face 14a of the silicide layer 14 and the upper end face 12a of the insulating film 12 is covered with the metal layer 15, with no gap between one part and another part of the metal layer 15 on the region. The conductor 13 may be polysilicon. The semiconductor layer 11 may be a silicon layer. The insulating film 12 may be a silicon oxide film. The upper surface electrode 16 may be made of aluminum.

The silicide layer 14 is formed by the reaction between the semiconductor layer 11 and the metal layer 15. The silicide layer 14 is made of nickel silicide.

Referring to FIG. 2, a side face 11b of the semiconductor layer 11 is located at elevations higher than the upper end face 12a of the insulating film 12 and is covered with the metal layer 15. The semiconductor layer surface 11a is located at elevations higher than the upper end face 12a of the insulating film 12, with a Schottky junction being formed between the semiconductor layer surface 11a and the silicide layer 14. The semiconductor layer surface 11a and the side face 11b of the semiconductor layer 11 extend with no gap therebetween, and the side face 11b of the semiconductor layer 11 is located between the silicide layer 14 and the upper end face 12a of the insulating film 12.

If the metal layer 15 is not provided, the side face 11b of the semiconductor layer 11 would be in direct contact with the upper surface electrode 16. During the application of a reverse voltage, a current would pass through the side face 11b. This would result in an increase in leakage current.

This problem can be averted by the semiconductor device A1 according to the present embodiment, in which the side face 11b of the semiconductor layer 11 is covered with the metal layer 15. The side face 11b of the semiconductor layer 11 is thus kept from direct contact with the upper surface electrode 16. The metallic element contained in the metal layer 15 is of the same kind as the metallic element contained in the silicide layer 14 forming the Schottky junction. That is, the metal forming the Schottky junction and the metal contained in the metal layer 15 are of the same kind, in which case the metal layer 15 provides a protective effect. More specifically, the metal layer 15 provides isolation between the side face 11b and the upper surface electrode 16 made of, for example, aluminum. During the application of a reverse voltage, a current is kept from passing through the side face 11b and the leakage current is kept low accordingly.

The upper surface electrode 16 is in contact with an upper surface of the silicide layer 14 in such a manner that an interface between the upper surface electrode 16 and the upper surface of the silicide layer 14 is located in an opening of the metal layer 15. Thus, the silicide layer 14 forming the Schottky junction is electrically connected directly to the upper surface electrode 16.

[Method for Manufacturing Semiconductor Device]

The following describes an example method for manufacturing the semiconductor device A1.

Figure 3:
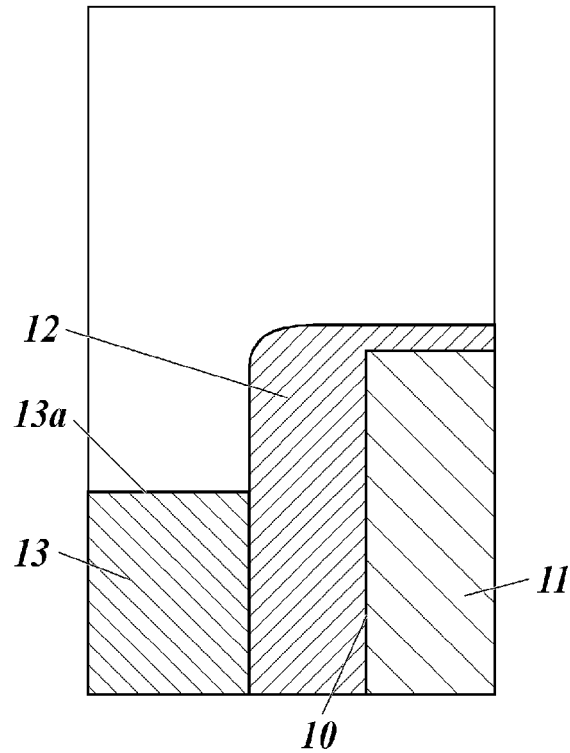
FIG. 3 is a schematic sectional view for explanation of a manufacturing process step involved in the production of the semiconductor device illustrated in FIG. 1.

(Step of Forming Insulating Film and Embedding Conductor) The insulating film 12 is formed on the surface of the semiconductor layer 11 having the trench 10, and the conductor 13 is then embedded in the trench 10 (see FIG. 3). It is to be ensured that an upper surface 13a of the conductor 13 is located within the trench 10.

(Step of Etching Insulating Film)

Figure 4:
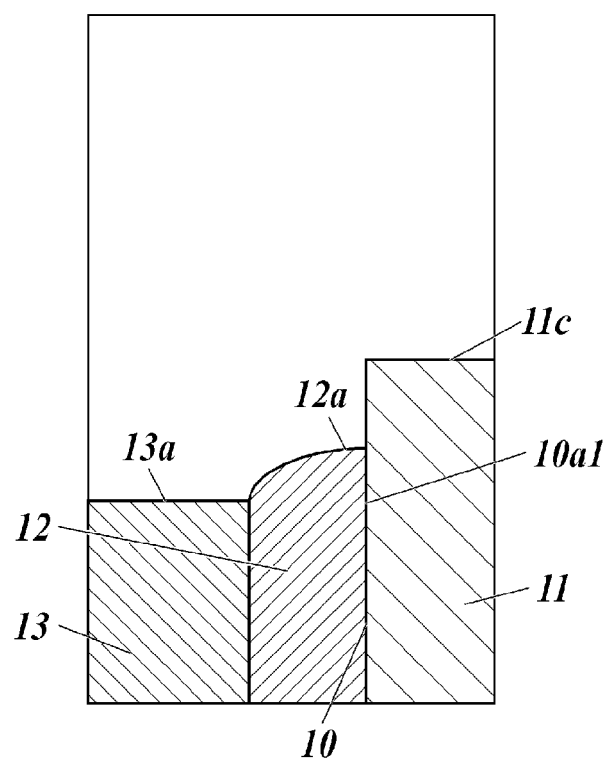
FIG. 4 is a schematic sectional view for explanation of a manufacturing process step subsequent to the manufacturing process step that will be described with reference to FIG. 3.

The insulating film 12 is then etched away from a region being part of the semiconductor layer surface 11a and being adjacent to the trench 10 such that a surface of the semiconductor layer 11 is exposed to view (see FIG. 4). The surface of the semiconductor layer 11 is hereinafter referred to as a semiconductor layer surface 11c. The insulating film 12 is overetched to ensure that the semiconductor layer surface 11c is sufficiently exposed to view. That is, the upper end face 12a of the insulating film 12 covering the inner wall surface 10a1 of the trench 10 is etched deeper. More specifically, the upper end face 12a of the insulating film 12 covering the inner wall surface 10a1 of the trench 10 is lowered beyond the semiconductor layer surface 11c. As can be seen in FIG. 4, the upper end face 12a is located at elevations lower than the semiconductor layer surface 11c. It is to be ensured that the insulating film on the semiconductor layer surface 11c is removed to a sufficient degree. With regard to the semiconductor device and the method for manufacturing the semiconductor device, the downward direction is herein regarded as meaning the direction in which the trench 10 in the surface of the semiconductor layer 11 is hollowed out, and the upward direction is herein regarded as meaning the reverse of it. These directions are not to be taken to mean the up-and-down direction (the direction of gravity) at the time of manufacturing of the semiconductor device or during periods of use of the semiconductor device.

(Step of Forming Schottky Junction)

Figure 5:
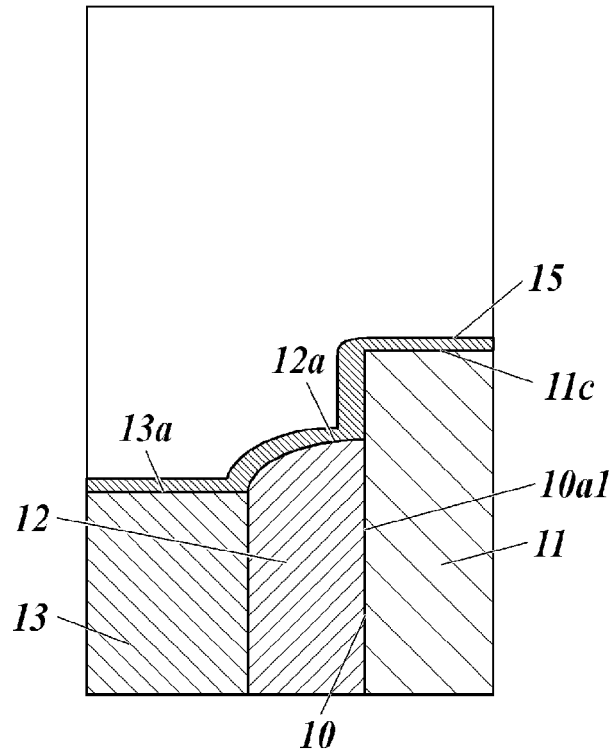
FIG. 5 is a schematic sectional view for explanation of a manufacturing process step subsequent to the manufacturing process step that will be described with reference to FIG. 4.
Figure 6:
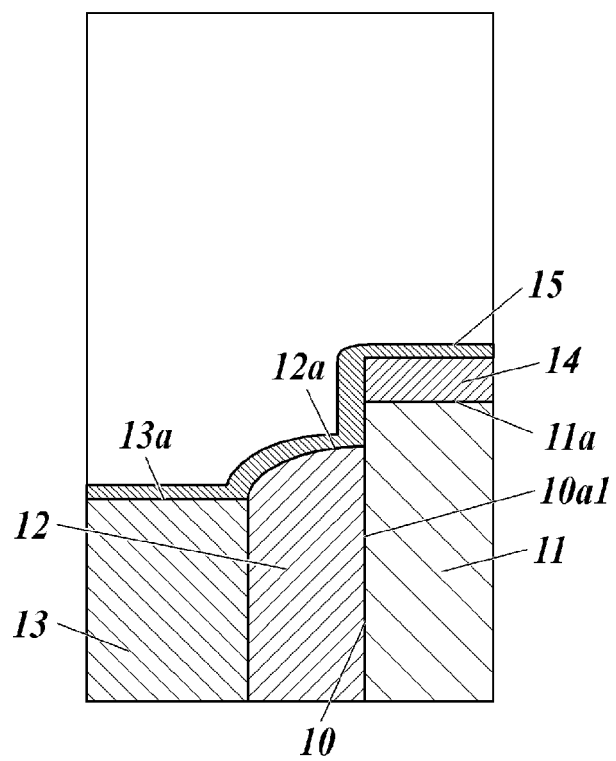
FIG. 6 is a schematic sectional view for explanation of a manufacturing process step subsequent to the manufacturing process step that will be described with reference to FIG. 5.

Subsequently, the metal layer 15 is formed on the semiconductor layer surface 11c, the upper end face 12a of the insulating film 12, and the upper surface 13a of the conductor 13 in such a manner that the metal layer 15 is in contact with the semiconductor layer surface 11c (see FIG. 5). The metal layer 15 and the semiconductor layer 11 are then subjected to heat treatment, where these layers react together to form the silicide layer 14 (see FIG. 6). Consequently, a Schottky junction is formed at an interface between the silicide layer 14 and the semiconductor layer 11 (the semiconductor layer surface 11a).

(Step of Forming Upper Surface Electrode)

Subsequently, an opening is formed in the metal layer 15. The silicide layer 14 and the metal layer 15 are then covered with, for example, aluminum, which is to serve as the upper surface electrode 16. The semiconductor device A1 obtained as above has the structure illustrated in FIGS. 1 and 2. The semiconductor device A1 undergoes some other steps before it is in finished form.

In this step, a region including the end face 14a of the silicide layer 14 and the upper end face 12a of the insulating film 12 is covered with the metal layer 15, with no gap between one part and another part of the metal layer 15 on the region. That is, an opening is formed by removing the metal layer 15 from the upper surface of the silicide layer 14 after the Schottky junction is formed while the region including the end face 14a of the silicide layer 14 and the upper end face 12a of the insulating film 12 is covered with the metal layer 15, with no gap between one part and another part of the metal layer 15 on the region. In the present embodiment, the side face 11b is included in the region concerned. The upper surface electrode 16 is then formed on the upper surface of the silicide layer 14 in such a manner that an interface between the upper surface electrode 16 and the upper surface of the silicide layer 14 is located in the opening.

In the present embodiment, the metal layer 15 on the upper surface 13a of the conductor 13 is left unremoved. In some embodiments, the metal layer 15 on the upper surface 13a is removed.

[Comparison of Reverse Characteristics]

Figure 7:
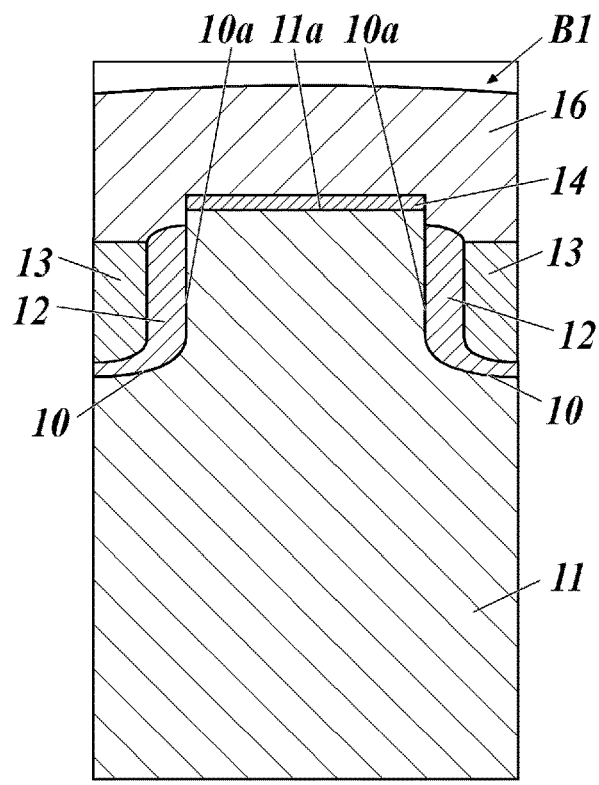
FIG. 7 is a schematic sectional view of a semiconductor device in Comparative Example.
Figure 8:
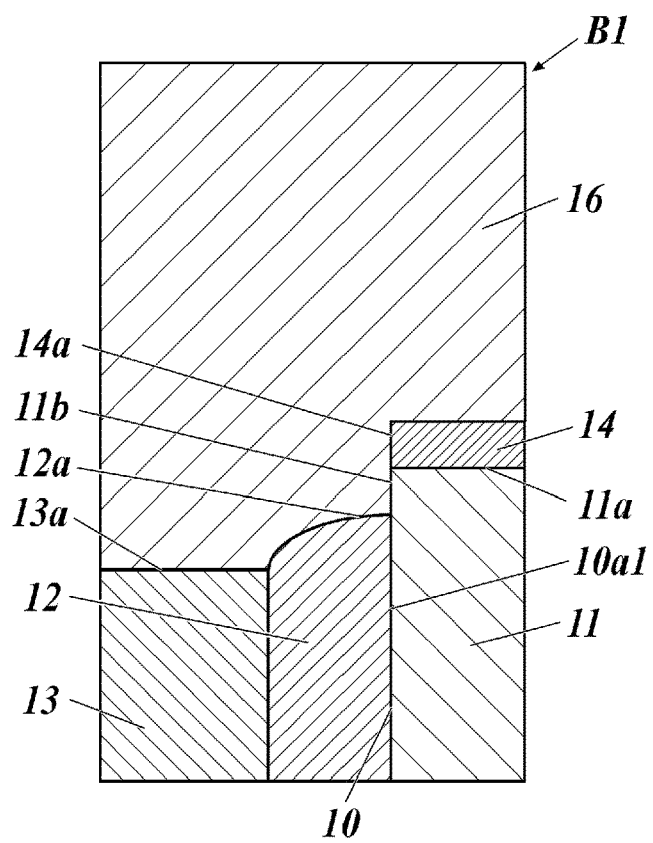
FIG. 8 is a partial enlargement of FIG. 7.

FIGS. 7 and 8 illustrate a semiconductor device B1 in Comparative Example. The semiconductor device B1 in Comparative Example differs from the semiconductor device A1 according to the present embodiment in the following respects only: (i) the semiconductor device B1 does not include the metal layer 15; and (ii) the upper surface electrode 16 of the semiconductor device B1 is in contact with the silicide layer 14, the upper end face 12a of the insulating film 12, and the upper surface 13a of the conductor 13. Unlike the manufacturing method according to the present embodiment, the method for manufacturing the semiconductor device B1 entails removing the entirety of the metal layer 15 before the step of forming an upper surface electrode.

Figure 9:
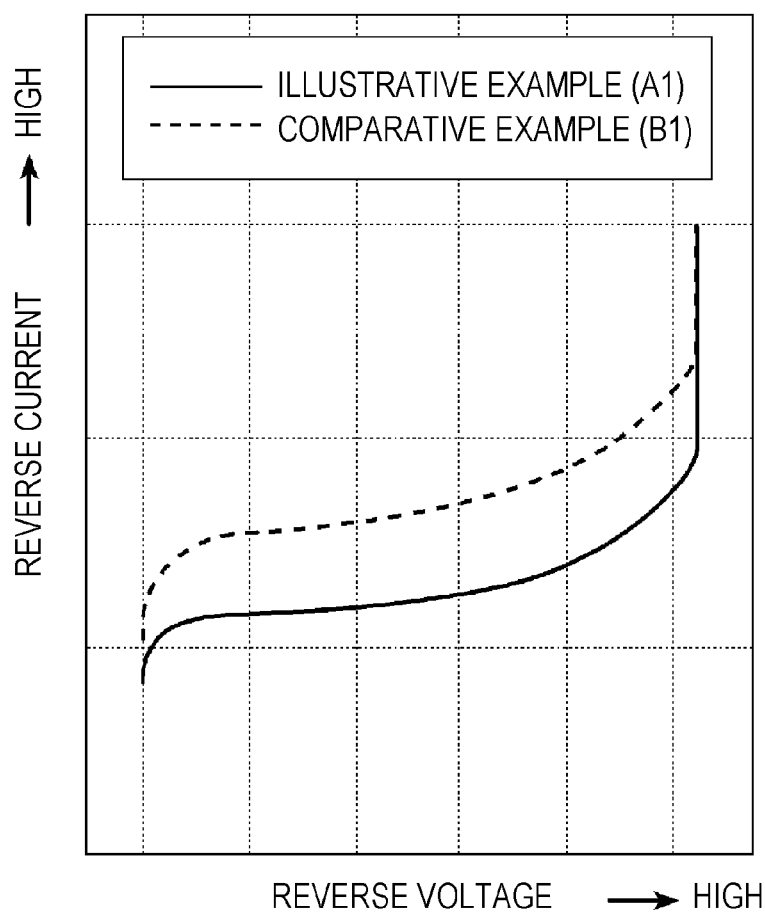
FIG. 9 illustrates the voltage-current characteristics measurements under reverse bias and graphically represents the characteristics in an illustrative example and the characteristics in Comparative Example.

Simulations were conducted on the semiconductor device A1 according to the present embodiment and the semiconductor device B1 in Comparative Example under the same condition. FIG. 9 illustrates the results of the voltage-current characteristics measurements under reverse bias.

As can be seen in FIG. 9, the reverse current was lower in the semiconductor device A1 according to the present embodiment than in the semiconductor device B1 in Comparative Example; that is, the semiconductor device A1 exhibited improved reverse characteristics.

The results revealed that the leakage current was kept low due to the protective effect provided by the metal layer 15.

CONCLUSION AND NOTES

The semiconductor device according to an embodiment of the present disclosure offers the following advantages. The leakage current that flows through an edge portion of the Schottky junction during the application of a reverse voltage is kept low due to the protective effect provided by the metal layer 15.

The insulating film on the semiconductor layer surface 11c is removed to a sufficient degree such that the semiconductor device exhibits favorable characteristics.

The manufacturing method according to an embodiment of the present disclosure enables manufacturing of a semiconductor device that offers the following advantages. During the application of a reverse voltage, the leakage current is kept low due to the protective effect provided by the metal layer 15.

The insulating film on the semiconductor layer surface 11c is removed to a sufficient degree such that the semiconductor device manufactured by the method exhibits favorable characteristics.

An embodiment of the present disclosure has been described herein above as an example. It is to be appreciated that the present disclosure may be implemented in various forms. One or more of the constituent elements may be omitted, replaced with another, or varied within a range not departing from the gist of the invention.

The silicide layer 14 and the upper surface electrode 16 in the embodiment above are connected directly to each other in the opening formed in the metal layer 15 on the silicide layer 14. In some embodiment, the silicide layer 14 and the upper surface electrode 16 may be electrically connected to each other with the metal layer 15 therebetween. This eliminates the need for the step of forming an opening in the metal layer 15.

The side face 11b of the semiconductor layer 11 in the embodiment above is located between the silicide layer 14 and the upper end face 12a of the insulating film 12. In some embodiments, the side face 11b of the semiconductor layer 11 is not located between the silicide layer 14 and the upper end face 12a of the insulating film 12. As in the embodiment above, the leakage current may be kept low when a peripheral portion of the Schottky junction (a region including the end face 14a and the upper end face 12a) is covered with the metal layer 15.

For example, the upper end face 12a of the insulating film 12 and the semiconductor layer surface 11a are at the same depth, or the upper end face 12a is located slightly above the semiconductor layer surface 11a. In such a case, a lower part of the end face 14a is covered with the insulating film 12, whereas an upper part of the end face 14a is not covered with the insulating film 12. If the insulating film 12 fails to provide a sufficient covering and protection of the peripheral portion of the Schottky junction, the leakage current would increase. As in the embodiment above, the leakage current may be kept low when the peripheral portion of the Schottky junction (the region including the end face 14a and the upper end face 12a) is covered with the metal layer 15.

Thus, the present disclosure is not limited to an embodiment in which the side face 11b of the semiconductor layer 11 is located between the silicide layer 14 and the upper end face 12a of the insulating film 12. Nevertheless, the present invention is effective in keeping the leakage current low, particularly when the side face 11b of the semiconductor layer 11 is located between the silicide layer 14 and the upper end face 12a of the insulating film 12.

In the embodiment above, the silicide layer 14 is formed by the reaction between the semiconductor layer 11 and the metal layer 15, and part of the metal layer 15 is left unremoved to provide the protective effect. As a matter of course, the same or similar effects may be attained in some embodiments in which the metal layer 15 is entirely removed and is replaced with another metal layer 15 containing a metallic element that is of the same kind as the metallic element contained in the previously formed metal layer 15. Nevertheless, the embodiment above involves a fewer number of steps and thus provides good production efficiency. The embodiment above also makes effective use of the metal layer for forming the silicide layer 14. Eliminating wasted materials results in increased cost-effectiveness.

INDUSTRIAL APPLICABILITY

The present disclosure is applicable to a semiconductor device and a method for manufacturing a semiconductor device.

REFERENCE SIGNS 10 trench
11 semiconductor layer
11a semiconductor layer surface
12 insulating film
13 conductor
14 silicide layer
15 metal layer
16 upper surface electrode
A1 semiconductor device

The invention claimed is:

1. A semiconductor device, comprising:
a semiconductor layer comprising a trench;
an insulating film covering an inner surface of the trench;
a conductor embedded in the trench covered with the insulating film;
a silicide layer, a Schottky junction being formed by the silicide layer and a region being part of a surface of the semiconductor layer and being adjacent to the trench; and
a metal layer covering a region comprising an end face of the silicide layer and an upper end face of the insulating film with no gap between one part and another part of the metal layer on the region, the end face being located at elevations higher than the upper end face of the insulating film covering an inner wall surface of the trench, wherein the metal layer and the silicide layer contain same kind of metallic element.

2. The semiconductor device according to claim 1, wherein the silicide layer is formed by reaction between the semiconductor layer and the metal layer.

3. The semiconductor device according to claim 1, wherein a region being part of a side face of the semiconductor layer and being located at elevations higher than the upper end face of the insulating film is covered with the metal layer.

4. The semiconductor device according to claim 1, further comprising an upper surface electrode on an upper surface of the silicide layer, wherein an interface between the upper surface electrode and the upper surface of the silicide layer is located in an opening of the metal layer.

* * * * *